United States Patent [19]

Borrill

[11] 4,362,899
[45] Dec. 7, 1982

[54] PRINTED CIRCUIT BOARD

[75] Inventor: Paul L. Borrill, Cranleigh, England

[73] Assignee: University College London, London, England

[21] Appl. No.: 193,109

[22] Filed: Oct. 2, 1980

[30] Foreign Application Priority Data

Oct. 5, 1979 [GB] United Kingdom ............... 7934603

[51] Int. Cl.$^3$ .......................................... H01B 11/08
[52] U.S. Cl. ...................................... 174/36; 174/32; 174/68.5; 174/117 PC; 361/409; 361/410
[58] Field of Search ...................... 174/32, 33, 34, 36, 174/117 PC, 117 FF, 68.5; 361/409, 410

[56] References Cited

U.S. PATENT DOCUMENTS

| | | | |
|---|---|---|---|
| 2,754,484 | 7/1956 | Adams | 174/33 X |
| 3,093,805 | 6/1963 | Osifchin | 174/117 PC |
| 3,135,935 | 6/1964 | Engelbrecht | 174/117 FF X |
| 3,459,879 | 8/1969 | Gerphiede | 174/36 X |
| 3,740,678 | 6/1973 | Hill | 174/117 FF X |
| 3,757,028 | 9/1973 | Schlessel | 174/34 X |
| 4,045,750 | 8/1977 | Marshall | 174/36 X |
| 4,130,723 | 12/1978 | Wakeling | 174/117 PC X |
| 4,157,612 | 6/1979 | Rainal | 174/32 X |

OTHER PUBLICATIONS

A. V. Brown, Fabricating Miniature Strip Lines, IBM Tech. Disc. Bull. vol. 12 #10, Mar. 1970, pp. 1637 and 1638, relied on.

Primary Examiner—R. R. Kucia
Attorney, Agent, or Firm—Cushman, Darby & Cushman

[57] ABSTRACT

A three layer printed circuit board comprises upper and lower layers which provide terminal locations for connection to pins of electrical connectors or electronic components which are to be connected in parallel by conductor tracks of the circuit board. In order to achieve an even distribution of conductor tracks between the layers, only certain terminal locations are connected to respective conductor tracks, the locations of the respective layers being electrically connected by plated-through holes. A conductive layer providing a ground plane is located between the upper and lower layers and has non-conductive areas providing clearance for the plated-through holes. Shield tracks are located between the conductor tracks and are connected to the ground plane by plated-through holes so that they form closed conductive loops providing shielding against capacitative and inductive cross-talk between the conductor tracks.

3 Claims, 4 Drawing Figures

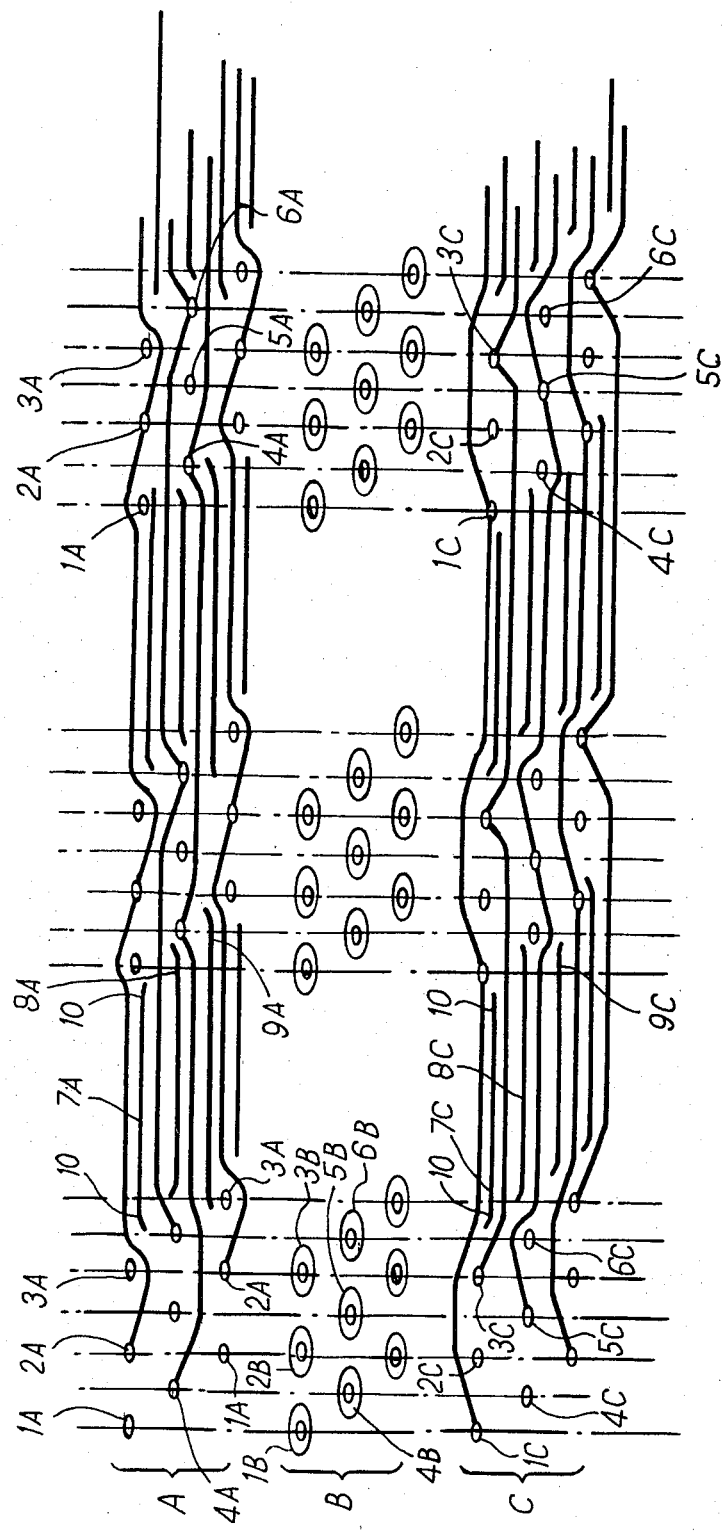

PRINTED CIRCUIT BOARD

BACKGROUND OF THE INVENTION

This invention concerns improvements in printed circuit boards, and relates more especially to printed circuit boards of the kind bearing multiple conductor arrays such as may form data buses of a data processor, e.g. a microprocessor.

With the increasing miniaturisation of data processors there is a corresponding demand for printed circuit boards in which the area occupied by a given number of conductor tracks is reduced to a minimum. In the case of conductor arrays such as form data buses, and thus comprise a simple array of parallel conductor tracks, the number of tracks capable of being accommodated in a given area is theoretically limited only by the minimum width of conductive track giving acceptable resistance of the conductor and the minimum distance between adjacent tracks necessary to achieve acceptable isolation of the respective conductors. In practice, however, the termination of the conductor tracks at individual electronic components or electrical terminal connectors imposes limits upon the physical spacing of the conductors. Also, with high frequency and square wave signals such as occur in microprocessor systems, cross-talk between conductors increases significantly as the distance between conductors is reduced. Mitigation of these problems is therefore highly desirable in order to achieve improved standards of miniaturisation.

SUMMARY OF THE INVENTION

It is accordingly one object of the invention to provide an improved multilayer printed circuit board providing an array of parallel conductor tracks, in which the number of terminal connections that can be made to parallel conductor tracks of the board for a given unit width of the board, is increased.

It is a further object of the invention to provide improved shielding of such parallel conductive tracks against cross-talk.

In accordance with one aspect of the invention there is provided a multilayer printed circuit board comprising an array of parallel conductor tracks spaced apart from one another, on one layer of the board; an array of parallel conductive shielding tracks arranged on said one layer of the board between said conductor tracks such that adjacent pairs of conductor tracks are each separated by an intermediate shielding track; conductor means provided on a further layer of the board; and means electrically connecting each of said shielding tracks at points spaced along its length to said conductor means on said further layer of the printed circuit board, whereby each said shielding track, in combination with said conductor means on said further layer of the board forms one or more closed, electrically conductive loops.

In an arrangement according to this aspect of the invention the said shielding tracks perform a twofold, and thus highly effective, shielding function in relation to said array of conductive tracks. Firstly, the physical location of the shielding tracks between the conductors, provides, more effectively when the shielding tracks are suitably connected to earth, shielding against capacitive cross-talk. Secondly, the connection of the shield tracks as closed loops in a plane at 90° to the plane of the board, provides shielding against inductive cross-talk, since electromagnetic fields due to signals in the electrical conductors set up eddy currents in, and are thus absorbed by, the said closed loops.

Preferably, the said conductor means on the said further layer of the printed circuit board comprises a ground plane provided by a continuous area of conductive material, and the said shielding conductors are electrically connected to said ground plane by means of so-called "plated-through holes". Plated-through holes are a means, well known in the art of printed circuit boards, for providing an electrical connection between conductor tracks between the respective layers of multiple layer printed circuit boards.

Although an arrangement in accordance with the invention provides for substantially reduced cross-talk between adjacent parallel conductor tracks, the requirement for additional shielding tracks intermediate to the conductor tracks does, to some extent reduce the number of conductor tracks capable of being accommodated within a given area. The correspondingly reduced density of the conductor tracks may be compensated for by providing two sets of conductor tracks on different layers of a printed circuit board, and arranging such tracks so that they connect with terminal locations common to both layers of the board.

According to another aspect of the invention, therefore, there is provided a printed circuit board including at least two layers, each of which comprises an array of parallel conductor tracks spaced apart from one another, and one or more arrays of terminal locations common to both layers of the board, said terminal locations of each array being arranged in rows extending transversely of the longitudinal axes of the said conductor tracks, and each said array including at least two such rows spaced apart in the direction of the longitudinal axes of said conductor tracks, the number of said terminal locations being equal to the total number of conductor tracks of both said layers, a substantially equal number of said conductor tracks of each layer connecting with respective ones of said terminal locations, the remaining terminal locations being connected to tracks of that layer, and the terminal locations of both layers of the board being interconnected by electrically conducting means extending between the respective layers of the board. Preferably, the said electrically conductive means comprise "plated-through holes".

According to a particularly advantageous embodiment of the invention, a conductor arrangement as defined above may be applied to a so-called "Eurocard" arrangement which comprises a 64 or 96-way DIN standard terminal connector, of which the 96 terminals are arranged in two or three rows respectively, each row containing 32 terminal locations at a spacing of 0.1". By utilising a printed circuit board having at least two layers, with correspondingly located terminal positions, it has proved possible in accordance with the invention to provide all 96 conductor tracks connecting to the 96 terminal positions of the DIN connector, the conductor tracks being equally distributed between two layers of the printed circuit board and having shielding tracks arranged in alternation therewith. Such an arrangement provides maximum utilisation of the two layers of the board of the electrical conductors, and the location thereof within the area dictated by the standard terminal connections. Preferably the board is a three-layer board in which an electrically conductive ground plane is interposed between the two layers of the board bearing the conductor arrays. The ground plane is connected to the shielding conductors, by means of plated-through holes as described above, and the conductive area of the ground plane includes clearance holes enabling the plated-through connection of the conductor arrays and the terminal locations, with electrical isolation from the ground plane.

BRIEF DESCRIPTION OF THE DRAWINGS

This invention is illustrated by way of example in the accompanying drawings, in which:

FIG. 4 is a diagrammatic perspective view illustrating the relationship between the respective conductor arrangements of the layers of FIGS. 1 to 3, over a small fragment of the area of the printed circuit board.

DESCRIPTION OF THE PREFERRED EMBODIMENT

Figure 1:
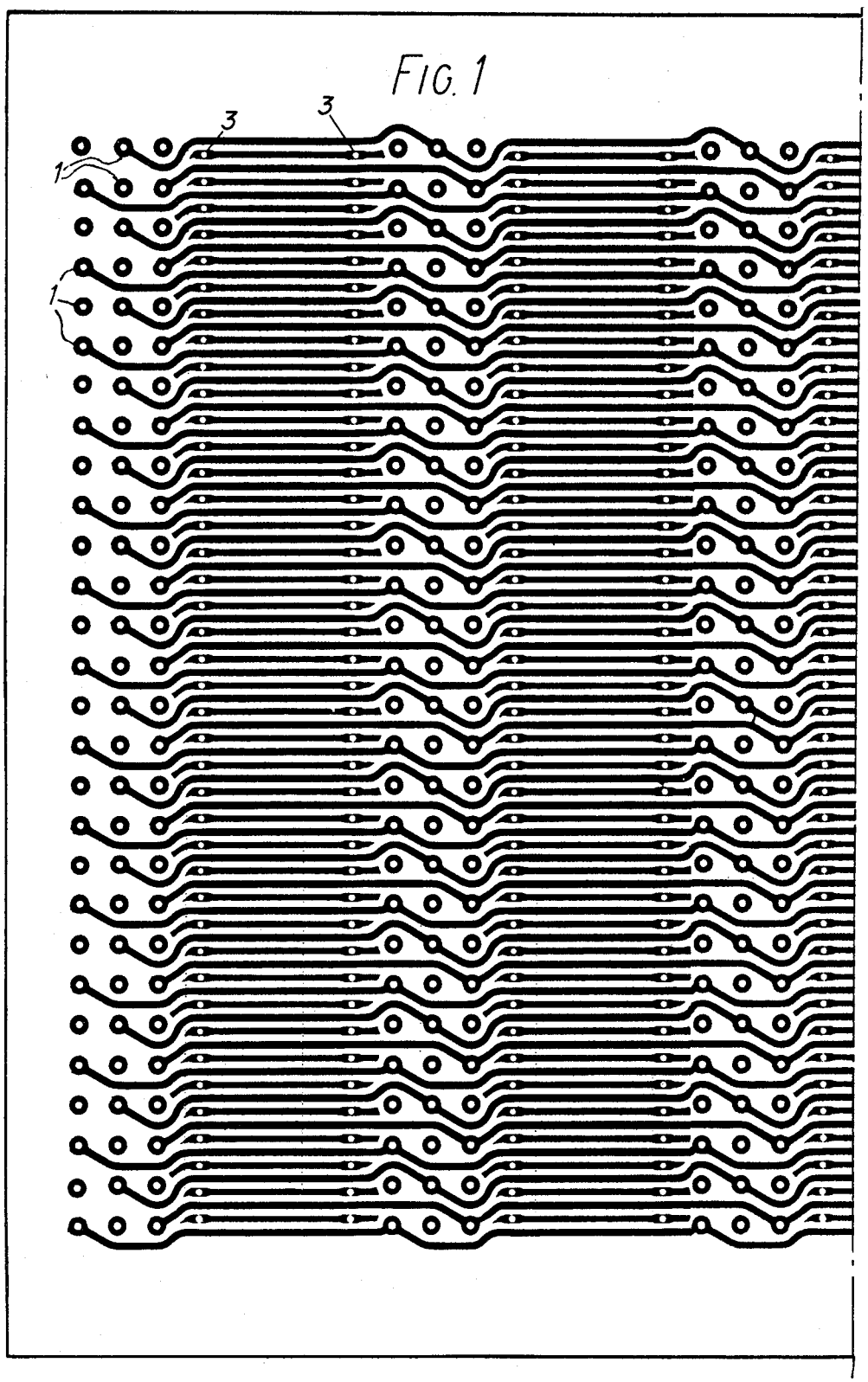
FIG. 1 is a fragmentary plan view showing the relevant part of a conductor and terminal arrangement of one layer of a typical three-layer printed circuit board in accordance with the invention, viewed from the component side of the board, in this figure only 84 "bussed" tracks were chosen in order to provide increased current carrying capacity on the outer rows of the connector.
Figure 2:
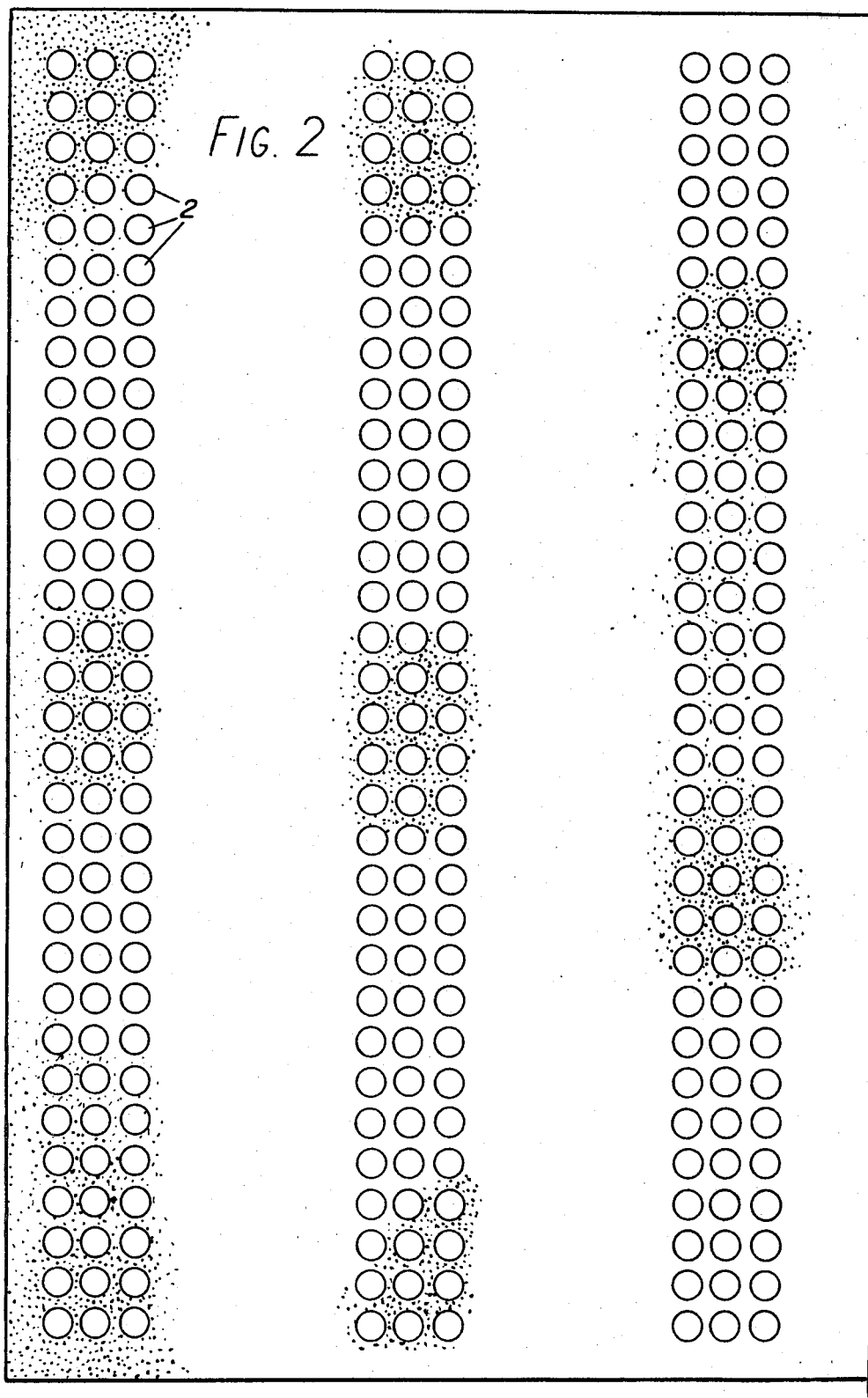
FIG. 2 is a fragmentary plan view showing the arrangement of the conductive layer of a second layer of the printed circuit board, providing a ground plane.
Figure 3:
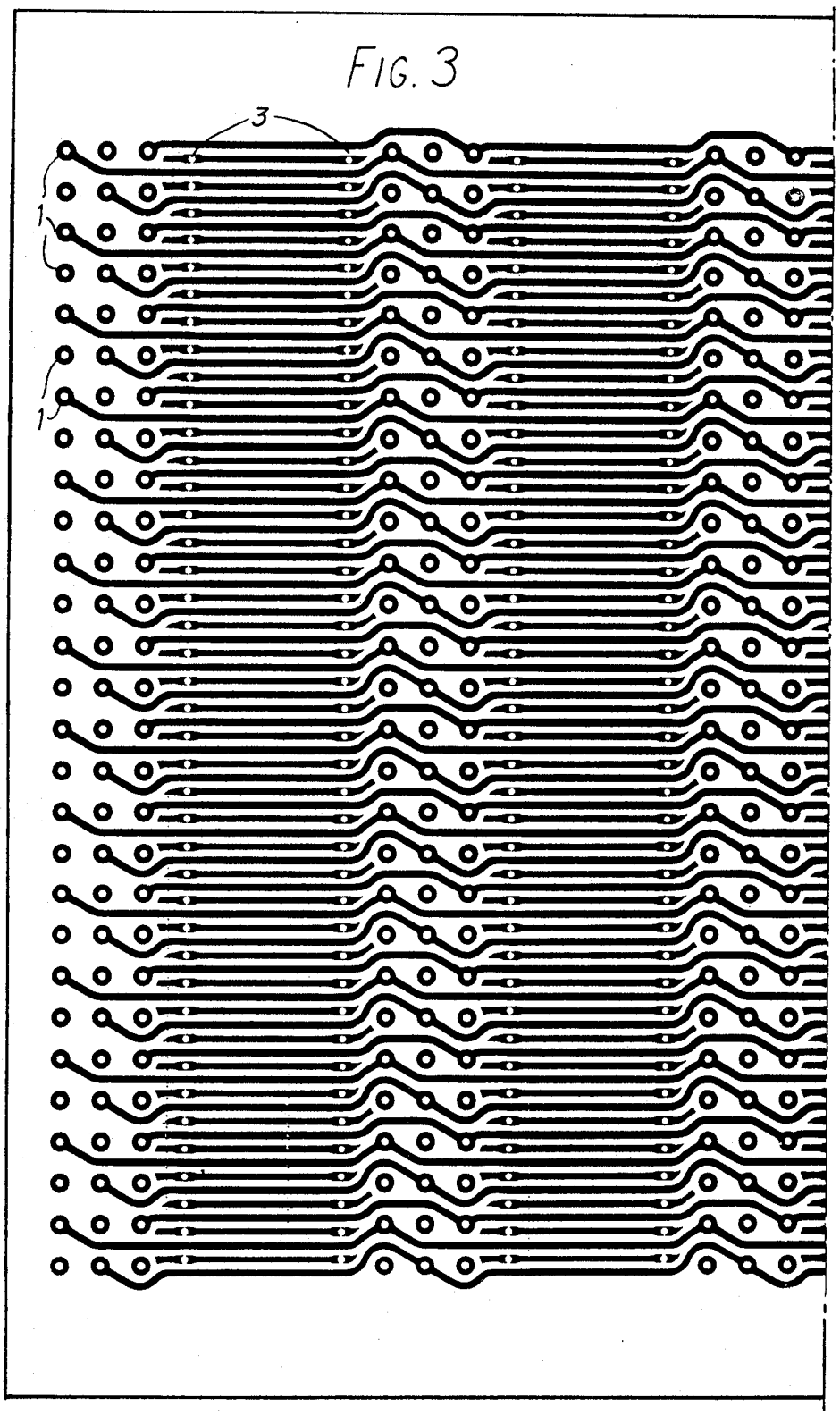
FIG. 3 is a fragmentary plan view, similar to FIG. 1, showing the conductor and terminal arrangement of the third layer of the printed circuit board, viewed from the solder-side of the board, i.e. viewed from the opposite side of the board from that of the view shown in FIG. 1.

Referring to FIGS. 1 to 3 of the drawings, it will be seen that the conductor arrangements shown therein comprise, at least in the case of FIGS. 1 and 3, a repetitive pattern extending transversely and lengthwise of the printed circuit board. In the case of the ground plane of FIG. 2, the conductive layers of the board provide a continuous conductive area which is interrupted only by clearance holes providing for electrical connection between the conductors of the layers of FIGS. 1 and 3. The complete printed circuit board comprises the conductive layers of FIGS. 1 and 3 arranged in back-to-back relationship, with the conductive pattern of FIG. 2 arranged as an intermediate ground plane sandwiched therebetween. The terminal locations indicated at 1 in FIGS. 1 and 3 are located in registration with one another and are interconnected by plated-through holes which pass through non-conductive areas 2 of the ground plane, and further plated-through holes indicated at 3 in FIGS. 1 and 3 provide electrical connection between shielding tracks of FIGS. 1 and 3, and the conductive area of the ground plane of FIG. 2, as will be described in more detail below.

Referring to FIG. 4, the relationship between the respective conductive patterns of the layers of FIGS. 1 to 3 is illustrated in more detail, wherein a small fragment of the repetitive pattern of the respective layers is shown in an exploded perspective diagrammatic view. In FIG. 4, the area A represents a fragment of the pattern shown in FIG. 1, the area B represents a fragment of the pattern shown in FIG. 2, and the area C represents a fragment of the pattern shown in FIG. 3. The left-hand edge of the drawing illustrates the conductor pattern at a terminal edge of the printed circuit board, whereas the conductor pattern extending towards the right-hand edge of the drawing is repeated continuously until it terminates in an edge pattern (not shown), in symmetry with that at the left-hand edge of the drawing. The pattern is also repeated in the transverse direction, as can be seen by reference to FIGS. 1 to 3. Each end of the tracking arrangement may alternatively be terminated by an electrical network which forms a termination impedance matched to the characteristic impedance of the tracks when considered as transmission lines.

The conductor tracks of the upper and lower layers of the printed circuit board shown in FIGS. 1 and 3, respectively, effectively connect in parallel a plurality of terminal locations which may be sub-divided into groups of six as illustrated in FIG. 4 at 1A to 6A and 1C to 6C for the upper and ower layers, respectively. The conductors of the upper tracks are directly connected to terminal locations 2A, 4A and 6A respectively, whereas those of the lower tracks are connected to locations 1C, 3C and 5C respectively. The unconnected locations 1A, 3A and 5A of the upper layer are electrically connected by plated-through holes to location 1C, 3C and 5C of the lower track, whereas the corresponding unconnected areas 2C, 4C and 6C of the lower track are likewise connected to the areas 2A, 4A and 6A of the upper track. Thus of each group of six terminals of a terminal connector secured to the printed circuit board, three are connected to conductor tracks of the upper layers and three to conductor tracks of the lower layers, so that the conductor tracks connected to the terminal of the connector are evenly distributed between the upper and lower layers of the printed circuit board. This fact in itself would aid the minimisation of cross-talk between adjacent conductors because the spacing between such conductors is maximised, indeed it is only because the spacing has been maximised in this way, that it is physically possible to interpose shielding tracks between conducting tracks on a backplane using the DIN 41612 connector leaving sufficient space to achieve acceptable isolation between all tracks.

As mentioned above, between the upper and lower layers of the printed circuit board, which provide the arrays of conductor tracks, there is interposed a ground plane of which the conductive pattern is illustrated at B in FIG. 4. The ground plane comprises a continuous layer of electrically conductive material which is broken only by non-conductive areas 1B to 6B at the centre of which are located apertures registering with the terminal areas 1A to 6A and 1C to 6C and accommodating the plated-through electrical connection between the upper and lower layers. The non-electrically conductive areas 1B to 6B are provided solely in order to avoid any unintentional electrical connection between the upper and lower terminal locations 1A to 6A, 1C to 6C and the electrically conductive layer of the ground plane.

Between each adjacent pair of electrically conductive tracks of the upper and lower layers A and C, there is arranged a shielding track indicated in FIG. 4 at 7A, 8A and 9A and 7C, 8C and 9C, respectively. Adjacent to each end of the shielding tracks 7A, 8A and 9A and 7C, 8C and 9C are arranged apertures 10 penetrating the printed circuit board, which apertures provide for plated-through connections between the corresponding point on the shielding tracks and the electrically conductive layer of the ground plane. Thus, each of the shield tracks 7A to 9A, 7C to 9C, in conjunction with the conductive layer of the ground plane B forms a closed-electrically conductive loop. Thus, electrically conductive shield tracks provide both capacitative shielding between adjacent conductive tracks, especially due to their electrical connection, via the ground plane, to earth, and inductive shielding of adjacent conductive tracks, due to the fact that eddy currents are induced therein by the electromagnetic fields set up by signal currents in the said conductor tracks. The said electromagnetic fields are thus absorbed within the electrically conductive loops provided by the shield tracks and inductive cross-talk between adjacent conductive tracks is correspondingly reduced.

From the above disclosure it will be appreciated that there has been provided a novel printed circuit board arrangement which provides optimum utilisation of the available printed circuit board area both as regards the density of distribution of the conductor tracks and as regards the utilisation of the intermediate shielding tracks to counteract cross-talk.

It will be appreciated that various alterations and modifications to the preferred embodiment of the invention described above may be made without departing from the scope of the invention as defined in the appended claims.

In particular, although the distribution of conductor tracks between upper and lower layers of the printed circuit board provides for optimum distribution of the conductor tracks, they may be dispensed with in cases where the required density of conductor distribution can be provided by a single conductive layer, and the reduction of cross-talk by means of the intermediate shielding track is of greater importance.

In cases where the distribution of conductor tracks between the upper and lower layers, in order to achieve optimum spacing of the conductor tracks, is of greater importance, such an arrangement may be utilised without the necessity for intermediate shielding tracks.

If desired, the number of layers of the circuit board may be increased above three, for example to provide for additional ground planes at the outer layers of a five layer board.

In addition the connection of each terminal on the connector to the corresponding terminal on all other connectors may be made on either side of the printed circuit board, or even, alternately on one side then on the other side between all the connectors on the printed circuit board. One further possible tracking arrangement exists which could have particular advantages in certain circumstances: the connection of tracks between all connectors along the printed circuit board could be made alternately on one side, then the other between all the connectors such that an effective spiral of two or more conducting tracks takes place along the printed circuit board, this arrangement provides a "twisted pair" like transmission line down the length of the printed circuit board. The twist being provided by the effective crossing over of conducting tracks at or near each plated-through hole.

I claim:

1. A multilayer printed circuit board comprising:
    at least two layers each having an array of linear parallel conductor tracks;
    at least one layer having a conductor area forming a ground plane, said ground plane layer being disposed between said two conductor track layers;
    a plurality of terminal arrays extending generally transversely to the longitudinal axes of said conductor tracks, said terminal arrays being spaced apart in the direction of the linear axes of said conductor tracks;
    electrically conductive means extending through the multiple layers of the printed circuit board for each terminal of each array, whereby each individual terminal of each array is electrically connected to a corresponding individual terminal of all other arrays, and all the terminals of each array are individually electrically connected to corresponding ones of the linear conductor tracks;
    each conductor track layer further having a plurality of arrays of linear parallel conductive shielding tracks, each shielding track being arranged between two adjacent conductor tracks and between two adjacent arrays of said terminals such that the opposite ends of each shielding track terminate adjacent terminal areas of said conductor tracks associated with respective ones of two adjacent terminal arrays; and
    electrically conductive means for connecting each of the shielding tracks of said two adjacent conductor track layers in common to the intermediate ground plane, said electrically conductive means extending between the respective layers of the circuit board in the regions of the two opposite ends of the shielding tracks.

2. A printed circuit board according to claim 1, comprising three layers of which the two outer layers comprise said conductor track layers and the intermediate layer comprises said ground plane layer, said linear conductors of said outer layers comprising microstrip transmission lines sharing a local dielectric between air and the printed circuit board substrate.

3. A printed circuit board according to claim 1 or 2, wherein the shielding tracks of the respective outer layers are arranged in registering superimposition and each pair of superimposed shielding tracks are connected in common to the ground plane by a single pair of electrically conductive means extending through the three layers of the circuit board.

* * * * *